United States Patent
Li

(10) Patent No.: US 7,891,065 B2
(45) Date of Patent: Feb. 22, 2011

(54) METHOD OF MANUFACTURING OF A LIQUID JET HEAD, METHOD OF MANUFACTURING OF A PIEZOELECTRIC ELEMENT AND A LIQUID JET APPARATUS

(75) Inventor: Xin-shan Li, Shiojiri (JP)

(73) Assignee: Seiko Epson Corporation, Shinjuku-ku, Tokyo (JP)

( * ) Notice: Subject to any disclaimer, the term of this patent is extended or adjusted under 35 U.S.C. 154(b) by 51 days.

(21) Appl. No.: 12/367,427

(22) Filed: Feb. 6, 2009

(65) Prior Publication Data

US 2009/0205180 A1    Aug. 20, 2009

(30) Foreign Application Priority Data

Feb. 7, 2008   (JP) ............................. 2008-028186
Dec. 24, 2008  (JP) ............................. 2008-328145

(51) Int. Cl.
*H01L 41/22*   (2006.01)
*H04R 17/00*   (2006.01)
*B23P 17/00*   (2006.01)
*B21D 53/76*   (2006.01)

(52) U.S. Cl. .................................... 29/25.35; 29/890.1
(58) Field of Classification Search ............... 29/25.35, 29/890.1, 846; 257/E27.006; 310/311, 312, 310/363, 365, 345; 427/100, 419.2, 419.3; 347/68, 70, 71
See application file for complete search history.

(56) References Cited

U.S. PATENT DOCUMENTS

| 2005/0159808 | A1* | 7/2005 | Johnson et al. | ............. 623/1.18 |
| 2006/0266121 | A1* | 11/2006 | Leybovich | .................. 73/597 |
| 2007/0227877 | A1* | 10/2007 | Wang | ..................... 204/192.1 |

FOREIGN PATENT DOCUMENTS

| JP | 05-085704 A | | 4/1993 |
| JP | 09-223831 A | | 8/1997 |
| JP | 2001-274472 | * | 10/2001 |
| JP | 2001-274472 A | | 10/2001 |
| JP | 2007-042949 A | | 2/2007 |
| JP | 2007-277082 A | | 10/2007 |

* cited by examiner

*Primary Examiner*—A. Dexter Tugbang
*Assistant Examiner*—David P Angwin
(74) *Attorney, Agent, or Firm*—Kilpatrick Townsend & Stockton LLP

(57) ABSTRACT

In a step of forming a piezoelectric precursor film, an application solution is applied onto each of flow passage forming substrate wafers to form piezoelectric precursor films one by one on each of the plurality of flow passage forming substrate wafers constituting a flow passage forming substrate wafer group, and an order of the flow passage forming substrate wafers for starting the application of the application solution to be turned into each of the piezoelectric precursor films is varied by the predetermined number of wafers of the flow passage forming substrate wafer group.

5 Claims, 9 Drawing Sheets

(a)

(b)

(c)

(a)

(b)

(c)

METHOD OF MANUFACTURING OF A LIQUID JET HEAD, METHOD OF MANUFACTURING OF A PIEZOELECTRIC ELEMENT AND A LIQUID JET APPARATUS

CROSS REFERENCE TO RELATED APPLICATIONS

The entire disclosure of Japanese Patent Application No. 2008-28186, filed Feb. 7, 2008 and Japanese Patent Application No. 2008-328145, filed Dec. 24, 2008 are incorporated by reference herein.

BACKGROUND OF THE INVENTION

1. Field of the Invention

The present invention relates to a method of manufacturing a liquid jet head, a method of manufacturing a piezoelectric element, and a liquid jet apparatus.

2. Description of Related Art

A piezoelectric element used for a liquid jet head or the like is an element in which a dielectric film made of a piezoelectric material having an electro-mechanical transduction function is interposed between two electrodes. For example, the dielectric film is made of a crystallized piezoelectric ceramics. Such a piezoelectric element is used as pressure generating means for ejecting a liquid from nozzle openings of a liquid jet head.

A method of manufacturing the piezoelectric element includes forming a lower electrode film on one surface of a substrate (a flow passage forming substrate) by a sputtering method, forming a piezoelectric layer on the lower electrode film by a sol-gel method or an MOD method, forming an upper electrode film on the piezoelectric layer by a sputtering method, and patterning the piezoelectric layer and the upper electrode film to from the piezoelectric element.

When the piezoelectric layer is formed, application of an application solution to be turned into a piezoelectric precursor film on the substrate is performed by a spin coating method.

Here, when the application solution to be turned into the piezoelectric precursor film is applied onto a flow passage forming substrate wafer by the spin coating method, the plurality of piezoelectric films are laminated on each of the flow passage forming substrate wafers by repeatedly performing a process of applying the application solution onto each of the flow passage forming substrate wafers of a flow passage forming substrate wafer group, which is constituted by the plurality of flow passage forming substrate wafers, to form one layer and a process of drying the application solution to form the piezoelectric precursor film. That is, after a first piezoelectric precursor film is formed on each of the flow passage forming substrate wafers, a second piezoelectric precursor film is sequentially formed on each of the flow passage forming substrate wafers.

However, a problem may occurs in that a deviation is caused in displacement characteristics of the piezoelectric element due to occurrence of a difference in the thickness of the applied application solution between the plurality of flow passage forming substrate wafers and occurrence of a difference in the thickness of the piezoelectric element formed by laminating the piezoelectric films between the flow passage forming substrate wafers.

Moreover, a problem may occur in that the deviation is caused in the displacement characteristics of the piezoelectric element due to occurrence of the difference in the thickness of the application solution applied in an in-plane direction of the flow passage forming substrate wafer when the application solution to be turned into the piezoelectric precursor film is applied onto the flow passage forming substrate wafers by the spin coating method and due to occurrence of the difference in the thickness of the piezoelectric elements formed by laminating the piezoelectric films.

Due to the difference in the displacement characteristics of the piezoelectric element, a problem may occur in that a difference occurs in liquid ejection characteristics of each liquid jet head when the liquid jet heads each having one chip size are formed by dividing the flow passage forming wafer. Moreover, a problem may also occur in that the liquid ejection characteristics cannot be obtained when the plurality of liquid jet heads are mounted on a liquid jet apparatus for use.

Moreover, these problems occur not only in the method of manufacturing the liquid jet head having the piezoelectric elements but also in a method of manufacturing a piezoelectric element used for other devices.

SUMMARY OF THE INVENTION

The invention is devised in order to solve at least some of the above-mentioned problems and can be embodied as the following aspects or applied examples.

In order to solve the above-mentioned problems, according to an aspect of the invention, there is provided a method of manufacturing a liquid jet head which ejects a liquid. The method includes the steps of: forming a lower electrode on one surface of a flow passage forming substrate wafer in which a plurality of flow passage forming substrates each provided with pressure generating chambers individually communicating with nozzle openings for ejecting the liquid are integrally formed; forming a piezoelectric layer, in which a plurality of piezoelectric films are laminated by repeatedly performing a step of forming a piezoelectric precursor film comprises holding the flow passage forming substrate wafer on a rotation table rotatably provided within an application chamber and applying an application solution to the lower electrode side of the flow passage forming substrate wafer while allowing the rotation table to rotate the flow passage forming substrate wafer and a step of forming the piezoelectric film by baking the piezoelectric precursor film; and forming an upper electrode on the piezoelectric layer. In the step of forming the piezoelectric precursor film, the application solution is applied onto each of the flow passage forming substrate wafers to form the piezoelectric precursor films one by one on each of the plurality of flow passage forming substrate wafers constituting a flow passage forming substrate wafer group, and an order of the flow passage forming substrate wafers for starting the application of the application solution to be turned into each of the piezoelectric precursor films is varied by a predetermined number of wafers of the flow passage forming substrate wafer group.

The features other than the above aspects and objects of the invention are apparent from the description of the specification with reference to the accompanying drawings.

BRIEF DESCRIPTION OF THE DRAWINGS

In order to further understand the invention and the advantages of the invention, the following description and the accompanying drawings will be together referred.

DESCRIPTION OF THE PREFERRED EMBODIMENTS

Figure 1:
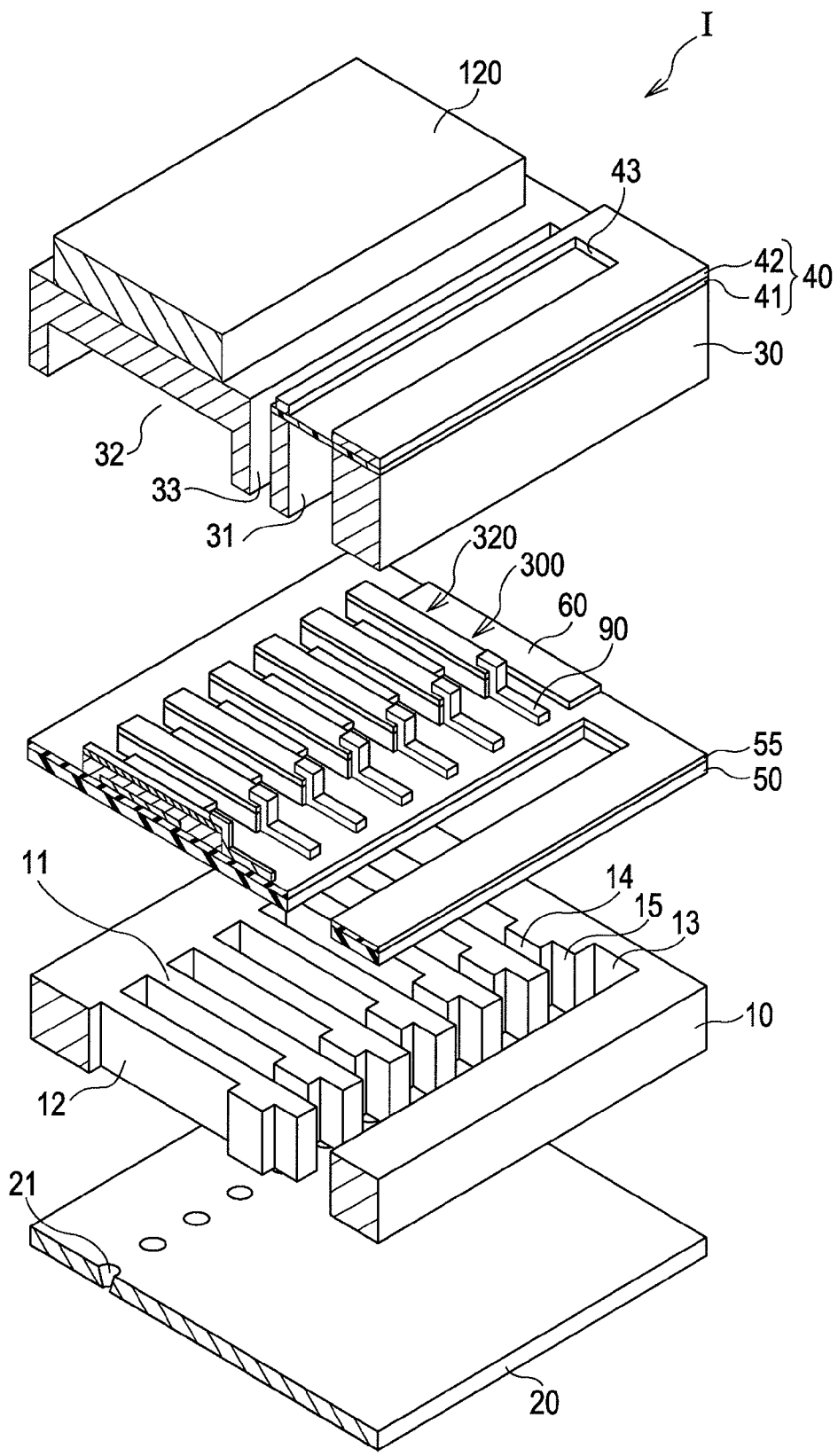
FIG. 1 is an exploded perspective view illustrating the general configuration of a printing head according to the invention.

At least the following is apparent from the description of the specification and the description of the accompanying drawings.

In order to solve the above-mentioned problems, according to an aspect of the invention, there is provided a method of manufacturing a liquid jet head. The method includes the steps of: forming a lower electrode on one surface of a flow passage forming substrate wafer in which a plurality of flow passage forming substrates each provided with pressure generating chambers individually communicating with nozzle openings for ejecting a liquid are integrally formed; forming a piezoelectric layer, in which a plurality of piezoelectric films are laminated by repeatedly performing a step of forming a piezoelectric precursor film comprises holding the flow passage forming substrate wafer on a rotation table rotatably provided within an application chamber and applying an application solution to the lower electrode side of the flow passage forming substrate wafer while allowing the rotation table to rotate the flow passage forming substrate wafer and a step of forming the piezoelectric film by baking the piezoelectric precursor film; and forming an upper electrode on the piezoelectric layer. In the step of forming the piezoelectric precursor film, the application solution is applied onto each of the flow passage forming substrate wafers to form the piezoelectric precursor films one by one on each of the plurality of flow passage forming substrate wafers constituting a flow passage forming substrate wafer group, and an order of the flow passage forming substrate wafers for starting the application of the application solution to be turned into each of the piezoelectric precursor films is varied by a predetermined number of wafers of the flow passage forming substrate wafer group.

According this aspect, it is possible to form the piezoelectric layer having a uniform thickness on each of the plurality of flow passage forming substrate wafers, since an application condition such as atmosphere or temperature under which the application solution is applied for starting and finishing the application solution is uniform by varying the order of the substrates for starting the application of the application solution, comparing to a case of starting the formation typically from a predetermined flow passage forming substrate wafer as the flow passage forming substrate wafer in which the application of the application solution is started. Accordingly, piezoelectric characteristics can be made uniform in the liquid jet heads separated from the plurality of flow passage forming substrate wafers, and thus liquid ejection characteristics can be made uniform.

Here, when the flow passage forming substrate wafer group is constituted by the flow passage forming substrate wafers of which the number is equal to or smaller than the number of piezoelectric precursor films laminated on each of the flow passage forming substrate wafers, it is preferable that the order of the flow passage forming substrate wafers for starting the application of the application solution is varied by one wafer. In addition, when the flow passage forming substrate wafer group is constituted by the flow passage forming substrate wafers of which the number is an n (where n is an integer) multiple of the number of piezoelectric precursor films laminated on each of the flow passage forming substrate wafers, it is preferable that the order of the flow passage forming substrate wafers for starting the application of the application solution is varied by the n number of wafers. With such a configuration, it is possible to form the piezoelectric layer having the uniform thickness on each of the plurality of flow passage forming substrate wafers, since the application condition such as atmosphere or temperature under which the application solution is applied at the time of starting and finishing the application solution is uniform.

In addition, in the step of forming the piezoelectric precursor films, it is preferable that the application solution is applied onto the flow passage forming substrate wafer under condition that an atmosphere within the application chamber is in saturated vapor of a solvent of the application solution and the application chamber is under pressure higher than outside atmospheric pressure. With such a configuration, the thickness of the application solution in the plane of each of the flow passage forming substrate wafers can be made uniform. Moreover, the piezoelectric characteristics in the plurality of liquid jet heads separated from one flow passage forming substrate wafer can be made uniform, and thus liquid ejection characteristics can be also made uniform. Accordingly, the piezoelectric characteristics can be made uniform and thus the liquid ejection characteristics can be uniform in the liquid jet heads separated from plurality of flow passage forming substrate wafers and all the plurality of liquid jet head separated from one flow passage forming substrate wafer.

It is preferable that the piezoelectric layer is made of lead zirconate titanate. Accordingly, the thickness of the piezoelectric layer made of lead zirconate titanate can be made uniform.

According to another aspect of the invention, there is provided method of manufacturing a liquid jet head. The method includes the steps of: forming a lower electrode on one surface of a flow passage forming substrate wafer in which a plurality of flow passage forming substrates each provided with pressure generating chambers individually communicating with nozzle openings for ejecting a liquid are integrally formed; forming a piezoelectric layer, in which a plurality of piezoelectric films are laminated by repeatedly performing a step of forming a piezoelectric precursor film comprises holding the flow passage forming substrate wafer on a rotation table rotatably provided within an application chamber and applying an application solution onto the lower electrode of the flow passage forming substrate wafer while allowing the rotation table to rotate the flow passage forming substrate wafer and a step of forming the piezoelectric film by baking the piezoelectric precursor film; and forming an upper electrode on the piezoelectric layer. In the step of forming the piezoelectric precursor film, the application solution is applied onto the flow passage forming substrate wafer under condition that an atmosphere within the application chamber is in saturated vapor of a solvent of the application solution and the application chamber is under pressure higher than outside atmospheric pressure.

According this aspect, the thickness of the application solution in the plane of each of the flow passage forming substrate wafers can be made uniform. Moreover, the piezoelectric characteristics in the plurality of liquid jet heads separated from one flow passage forming substrate wafer can be made uniform, and thus liquid ejection characteristics can be also made uniform.

According to still another aspect of the invention, there is provided a liquid jet apparatus including the liquid jet head according to the above aspects. According to this aspect, it is possible to embody the liquid jet apparatus capable of realizing uniformity of the liquid ejection characteristics by allowing the piezoelectric characteristics to be uniform. Moreover, it is possible to easily control the liquid jet head capable of realizing uniformity of the liquid ejection characteristics.

According to still another aspect of the invention, there is provided a method of manufacturing a piezoelectric element. The method includes the steps of: forming a lower electrode on a substrate; forming a piezoelectric layer, in which a plurality of piezoelectric films are laminated by repeatedly performing a step of forming a piezoelectric precursor film comprises holding the substrate on a rotation table rotatably provided within an application chamber and applying an application solution to the lower electrode side of the substrate while allowing the rotation table to rotate the substrate and a step of forming the piezoelectric film by baking the piezoelectric precursor film; and forming an upper electrode on the piezoelectric layer. In the step of forming the piezoelectric precursor film, the application solution is applied onto each of the substrates to form the piezoelectric precursor films one by one on each of the plurality of substrates constituting a substrate group, and an order of the substrates for starting the application of the application solution to be turned into the piezoelectric precursor film is varied by a predetermined number of substrates of the substrate group.

According to this aspect, it is possible to form the piezoelectric layer having a uniform thickness on each of the plurality of substrates, since the application condition such as atmosphere or temperature under which the application solution is applied at the time of starting and finishing the application is uniform by varying the order of the substrates for starting the application, comparing to a case of starting the formation typically from a predetermined substrate as the substrate in which the application of the application solution to be turned into the piezoelectric precursor film is started.

According to still another aspect of the invention, there is provided a method of manufacturing a piezoelectric element. The method includes the steps of: forming a lower electrode on a substrate; forming a piezoelectric layer, in which a plurality of piezoelectric films are laminated by repeatedly performing a step of forming a piezoelectric precursor film comprises holding the substrate on a rotation table rotatably provided within an application chamber and applying an application solution to the lower electrode side of the substrate while allowing the rotation table to rotate the substrate and a step of forming the piezoelectric film by baking the piezoelectric precursor film; and forming an upper electrode on the piezoelectric layer. In the step of forming the piezoelectric precursor film, the application solution is applied onto the substrate under condition that an atmosphere within the application chamber is in saturated vapor of a solvent of the application solution and the application chamber is under pressure higher than outside atmospheric pressure.

According to this aspect, the thickness of the application solution in the plane of the substrate can be made uniform and the piezoelectric characteristics can be made uniform.

Hereinafter, exemplary embodiments of the invention will be described with reference to the drawings. The embodiments described below are just described as examples of the invention and all constituent elements described below are not essential constituent elements.

Preferred Embodiment

Hereinafter, the embodiments will be described with reference to the drawings.

(Ink Jet Printing Head)

First, the basic configuration of an ink jet printing head as an example of a liquid jet head according to the invention will be described.

Figure 2:
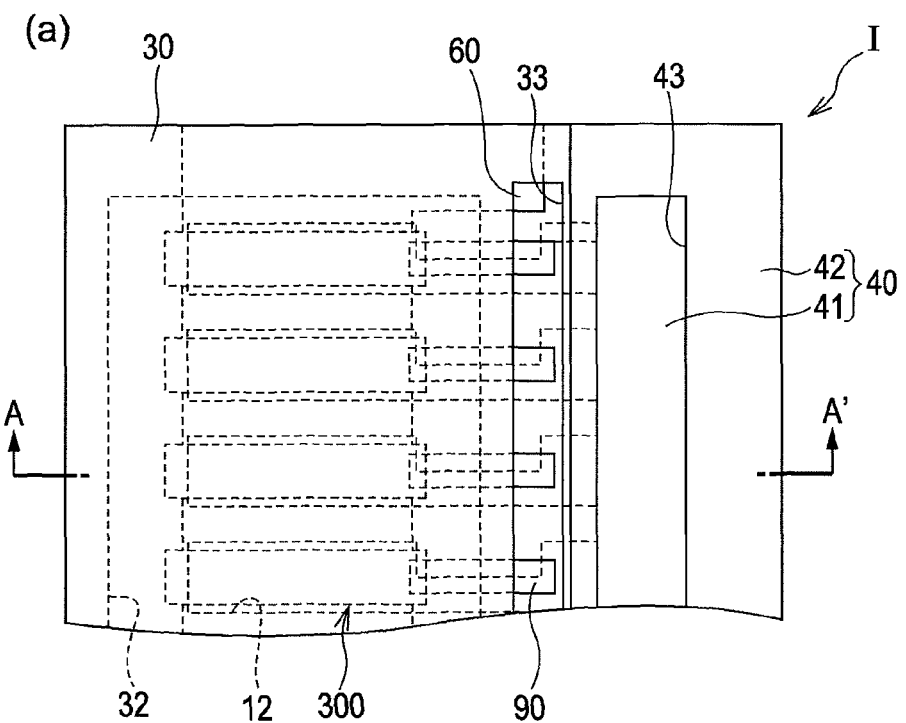
FIG. 2 is a plan view and a sectional view illustrating the printing head according to the invention.
Figure 2:
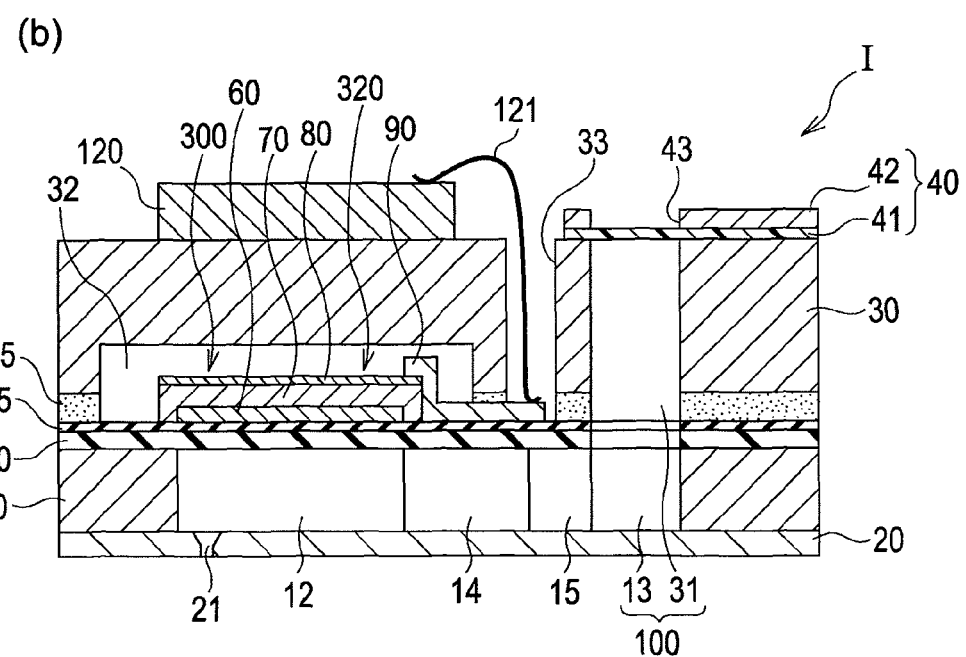

FIG. 1 is an exploded perspective view illustrating the general configuration of the ink jet printing head according to a first embodiment of the invention. FIG. 2 is a plan view of FIG. 1 and a sectional view taken along the line A-A' of the plan view.

As illustrated, a flow passage forming substrate 10 is formed of a silicon single crystal substrate. An elastic film 50 made of silicon dioxide is formed on one surface of the flow passage forming substrate.

The flow passage forming substrate 10 is provided with a plurality of pressure generating chambers 12 formed in parallel in a width direction of the flow passage forming substrate. A communication section 13 is formed in an outside area in a longitudinal direction of the pressure generating chambers 12 of the flow passage forming substrate 10. The communication section 13 and the pressure generating chambers 12 communicate with each other through ink supply passages 14 and communication passages 15 individually provided in the pressure generating chambers 12. The communication section 13 communicating with a reservoir section 31 of a protective substrate described below forms a part of a reservoir serving as a common ink chamber of the pressure generating chambers 12. Each of the ink supply passages 14 is formed so as to have a width narrower than that of the pressure generating chamber 12 and uniformly maintains a flow resistance of ink flowing from the communication section 13 to the pressure generating chamber 12. In this embodiment, the ink supply passage 14 is formed by narrowing the width of the flow passage from one side, but may be formed by narrowing the width of the flow passage from both sides. Alternatively, the ink supply passage may be formed not by narrowing the width of the flow passage but by narrowing the flow passage in a thickness direction.

A nozzle plate 20 having nozzle openings 21 punched therethrough and individually communicating with the vicinities of the ends of the pressure generating chambers 12 opposite the ink supply passages 14 is fixed and adhered to an opening surface of the flow passage forming substrate 10 by an adhesive, a heat welding film, or the like. The nozzle plate 20 is formed of glass ceramics, a silicon single crystal substrate, or stainless steel, for example.

On the other hand, the elastic film 50 is formed on the side opposite the opening surface of the flow passage forming substrate 10, as described above. An insulating film 55 is formed on the elastic film 50. Additionally, a lower electrode film 60, a piezoelectric layer 70, and an upper electrode film 80 are laminated on the insulating film 55 by a process described below to form each of piezoelectric elements 300. Here, the piezoelectric element 300 refers to a portion containing the lower electrode 60, the piezoelectric layer 70, and the upper electrode film 80. In general, one of the electrodes of the piezoelectric element 300 serves as a common electrode and the other thereof and the piezoelectric layer 70 are patterned in each of the pressure generating chambers 12. In addition, a portion which is formed by the one patterned electrode and the piezoelectric layer 70 and in which piezoelectric deformation occurs by application of voltage to both the electrodes is referred to as a piezoelectric active portion. In this embodiment, the lower electrode film 60 serves as a common electrode of the piezoelectric element 300 and the upper electrode film 80 serves as an individual electrode of the piezoelectric element 300. However, the reverse configuration is also possible depending on the restriction on a driving circuit or wirings. Here, each of the piezoelectric elements 300 and all vibration plates to be displaced by drive of the piezoelectric elements 300 are referred to as an actuator device. In this embodiment, the elastic film 50, the insulating film 55, and the lower electrode film 60 serve as the vibration plate. Of course, the invention is not limited thereto. For example, only the lower electrode film 60 may serve as the vibration plate without providing the elastic film 50 and the insulating film 55. Alternatively, the piezoelectric elements 300 may practically serve as the vibration plate.

The piezoelectric layer 70 is made of a piezoelectric material of which the lower electrode film 60 is formed and which has an electro-mechanical conversion feature. It is preferable that the piezoelectric layer 70 is formed of a crystallization film having a perovskite structure. For example, the ferroelectric material such as lead zirconate titanate (PZT) or a material formed by adding metal oxide such as niobium oxide, nickel oxide, or magnesium oxide to lead zirconate titanate is suitable. Specifically, lead titanate ($PbTiO_3$), lead zirconate titanate ($Pb(Zr, Ti)O_3$), lead zirconate acid ($PbZrO_3$), lead lanthanum titanate (($Pb, La), TiO_3$), lead lanthanum zirconate titanate (($Pb, La)(Zr, Ti)O_3$), lead magnesium niobate zirconate titanate ($Pb(Zr, Ti)(Mg, Nb)O_3$), or like can be used. The thickness of the piezoelectric layer 70 is restricted to the extent that crack does not occur in a manufacturing process and is formed so that a sufficient displacement characteristic is achieved. In this embodiment, for example, the thickness of the piezoelectric layer 70 is in the range of about 1 μm to 2 μm.

A lead electrode 90 which is drawn from the vicinity of the end of the ink supply passage 14 and extends up to the insulating film 55 and which is made of gold (Au), for example, is connected to each of the upper electrode film 80 as an individual electrode of the piezoelectric element 300.

A protective substrate 30 having a reservoir section 31 forming at least a part of the reservoir 100 is joined to the passage forming substrate 10 provided with the piezoelectric elements 300, that is, to the lower electrode film 60, the insulating film 55, and the lead electrodes 90 through the adhesive 35. In this embodiment, the reservoir section 31 is perforated through the protective substrate 30 in the thickness direction thereof and formed in the width direction of the pressure generating chambers 12. In addition, as described above, the reservoir section communicates with the communication section 13 of the passage forming substrate 10 to form the reservoir 100 as the common ink chamber of the pressure generating chambers 12. Only the reservoir section 31 may be configured to serve as the reservoir by partitioning the communication section 13 of the passage forming substrate 10 in every pressure generating chamber 12. Alternatively, only the pressure generating chambers 12 are provided in the passage forming substrate 10 and the ink supply passages 14 communicating with the reservoir and the pressure generating chambers 12 may be formed in members (for example, the elastic film 50, the insulating film 55, and the like) interposed between the passage forming substrate 10 and the protective substrate 30.

A piezoelectric element preserver 32 ensuring a space so as not to interrupt the movement of the piezoelectric elements 300 is formed in an area opposed to the piezoelectric elements 300 of the protective substrate 30. The piezoelectric element preserver 32 has the space so as not to interrupt the movement of the piezoelectric elements 300. In addition, the space may be sealed in an airtight manner or not sealed.

It is preferable that the protective substrate 30 is made of a material such as glass or a ceramic material having the almost same thermal expansibility as that of the passage forming substrate 10. In this embodiment, the protective substrate is formed of a silicon single crystal substrate which is the same material as that of the passage forming substrate 10.

A through-hole 33 perforated through the protective substrate 30 in the thickness direction thereof is formed in the protective substrate 30. The lead electrodes 90 are drawn from the piezoelectric elements 300, respectively, so that the vicinities of the ends thereof are exposed in the through-hole 33.

A driving circuit 120 for driving the piezoelectric elements 300 arranged in parallel is fixed onto the protective substrate 30. As the driving circuit 120, a circuit substrate or a semiconductor integrated circuit (IC) can be used, for example. The driving circuit 120 and the lead electrodes 90 are electrically connected to each other through connection wirings 121 formed of a conductive wire such as a bonding wire.

A compliance substrate 40 including a sealing film 41 and a fixing plate 42 is joined onto the protective substrate 30. The sealing film 41 is made of a material having a low rigidity and a flexible property. One surface of the reservoir section 31 is sealed by the sealing film 41. The fixing plate 42 is made of a material having a relatively hard property. Since an area opposite the reservoir 100 of the fixing plate 42 is formed as an opening 43 completely removed in the thickness direction, one surface of the reservoir 100 is sealed only by the sealing film 41 having a flexible property.

In the ink jet print head according to this embodiment, ink is supplied from an ink introduction port connected to external ink supplying means (not shown), the inside from the reservoir 100 to the nozzle openings 21 is filled with the ink, and ink droplets are ejected from the nozzle openings 21 by applying voltage between the lower electrode film 60 and the upper electrode film 80 corresponding to each of the pressure generating chambers 12 in accordance with a print signal supplied from the driving circuit 120, deforming the elastic film 50, the insulating film 55, the lower electrode film 60, and the piezoelectric layer 70 so as to be bent, and increasing the pressure of each of the pressure generating chambers 12.

(Method of Manufacturing Ink Jet Printing Head)

Hereinafter, a basic method of manufacturing the above-described ink jet printing head will be described with reference to FIGS. 3 to 8. FIGS. 3 to FIG. 8 are sectional views illustrating the method of manufacturing the ink jet printing head.

Figure 3:
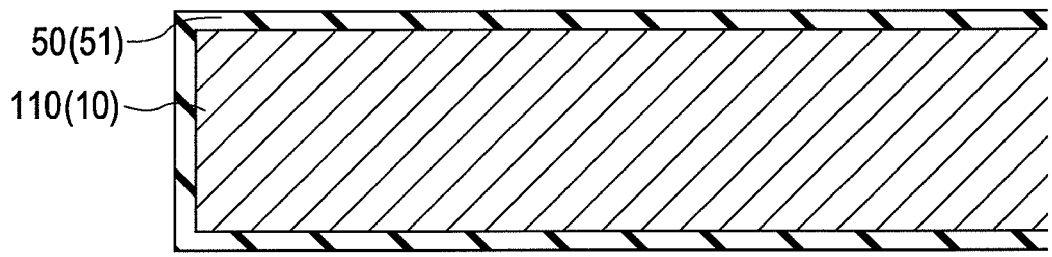
FIG. 3 is a sectional view illustrating a method of manufacturing the printing head according to the invention.
Figure 3:
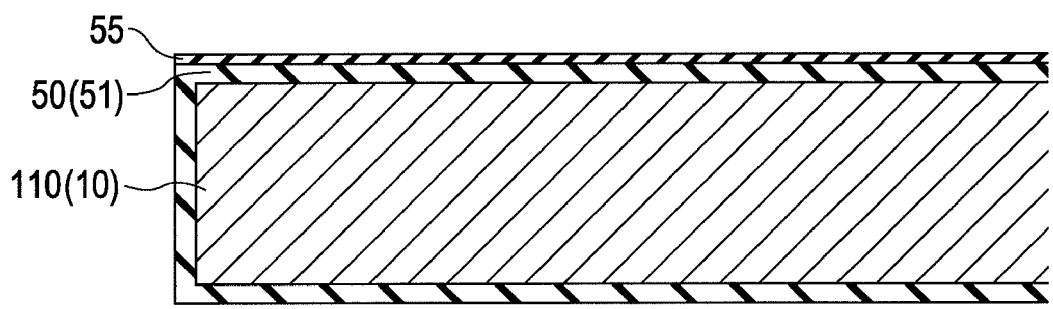
Figure 3:
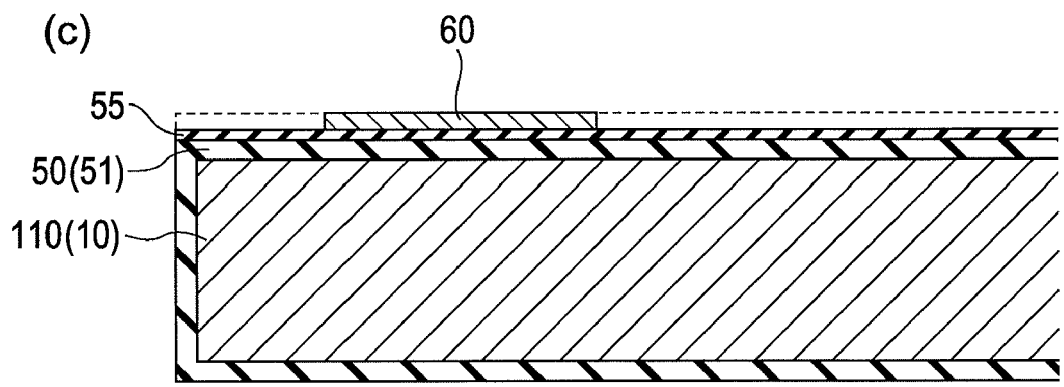

First, as shown in (a) of FIG. 3, a silicon dioxide film 51 formed of a silicon dioxide ($SiO_2$) and forming elastic film 50 is formed on the surface of the flow passage forming substrate wafer 110 as a silicon wafer which is formed integrally by the plurality of flow passage forming substrates 10. Subsequently, as shown in (b) of FIG. 3, the insulating film 55 made of zirconium oxide is formed on the elastic film 50 (the silicon dioxide film 51).

Subsequently, as shown in (c) of FIG. 3, the lower electrode film 60 is formed on the entire surface of the insulating film 55 and patterned in a predetermined shape. The material of the lower electrode film 60 is not particularly limited. However, when lead zirconate titanate (PZT) of the piezoelectric layer 70 is used, it is preferable that a material in which conductivity variation caused by diffusion of lead oxide is small is used. Therefore, as the material of the lower electrode film 60, platinum, iridium, or the like is preferred. In addition, the lower electrode film 60 can be formed by a sputtering method or a CVD method (Chemical Vapor Deposition), for example.

Subsequently, the piezoelectric layer 70 made of lead zirconate titanate (PZT) is formed on the surface on which the lower electrode film 60 of the flow passage forming substrate wafer 110 is formed. In this embodiment, the piezoelectric layer 70 is formed by use of a so-called sol-gel method of applying and drying a so-called sol (application solution) obtained by dissolving and dispersing a metal organic substance with a solvent to make a gel and baking the gel at a high temperature to obtain the piezoelectric layer 70 made of metal oxide. The method of the manufacturing the piezoelectric layer 70 is not limited to the sol-gel method, but an MOD (Metal-Organic Decomposition) method may be used.

A specific sequence of manufacturing the piezoelectric layer 70 will be described. First, as shown in (a) of FIG. 4, the piezoelectric precursor film 71 as the PZT precursor film is formed on the lower electrode film 60. That is, a sol (application solution) containing the metal organic substance is applied onto the flow passage forming substrate 10 provided with the lower electrode film 60 by a spin coating method (applying process). Subsequently, the piezoelectric precursor film 71 is heated at a predetermined temperature and dried for certain time (drying process). Subsequently, the dried piezoelectric precursor film 71 is heated at a predetermined temperature to remove fat and maintained for certain time (fat-removing process). Subsequently, as shown in (b) of FIG. 4, the piezoelectric precursor film 71 is crystallized by heating the piezoelectric precursor film at a predetermined temperature and maintaining the predetermined temperature for certain time, and the piezoelectric film 72 is formed (baking process).

As a heating apparatus used in the drying process, the fat-removing process, and the baking process, a hot plate or an RTP (Rapid Thermal Processing) apparatus performing heating by emission of an infrared lamp can be used, for example.

Figure 4:
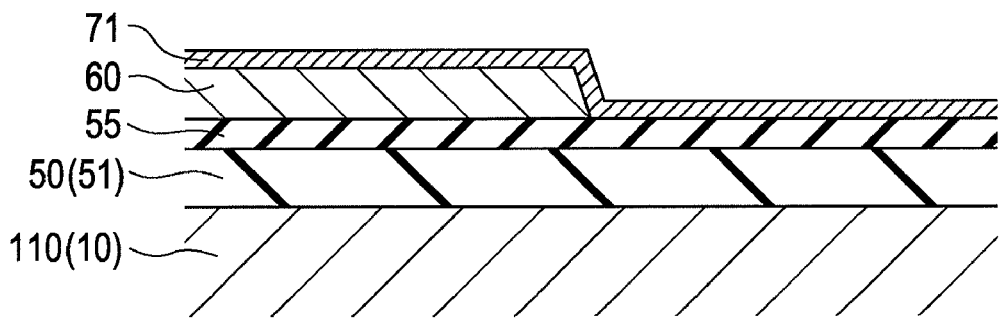
FIG. 4 is a sectional view illustrating the method of manufacturing the printing head according to the invention.
Figure 4:
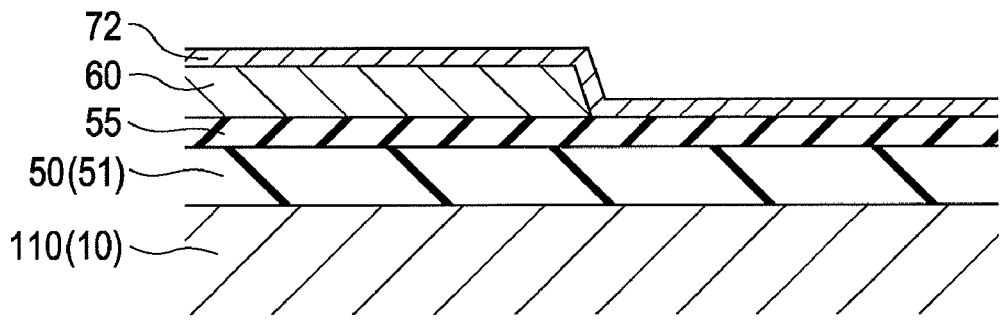
Figure 4:
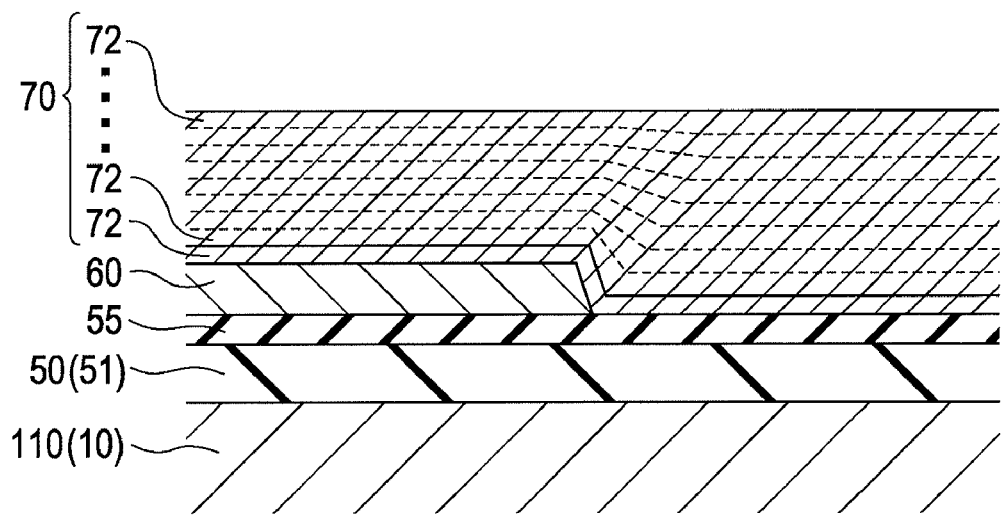

The piezoelectric layer 70 obtained by laminating a plurality of the piezoelectric films 72 shown in (c) of FIG. 4 is formed by repeatedly performing the piezoelectric film forming process including the applying process, the drying process, the fat-removing process, and the baking process described above. For example, when the film thickness per one time application of sol is about 0.1 μm, the whole film thickness of the piezoelectric layer 70 constituted by twelve piezoelectric films 72 is about 1.2 μm.

Figure 5:
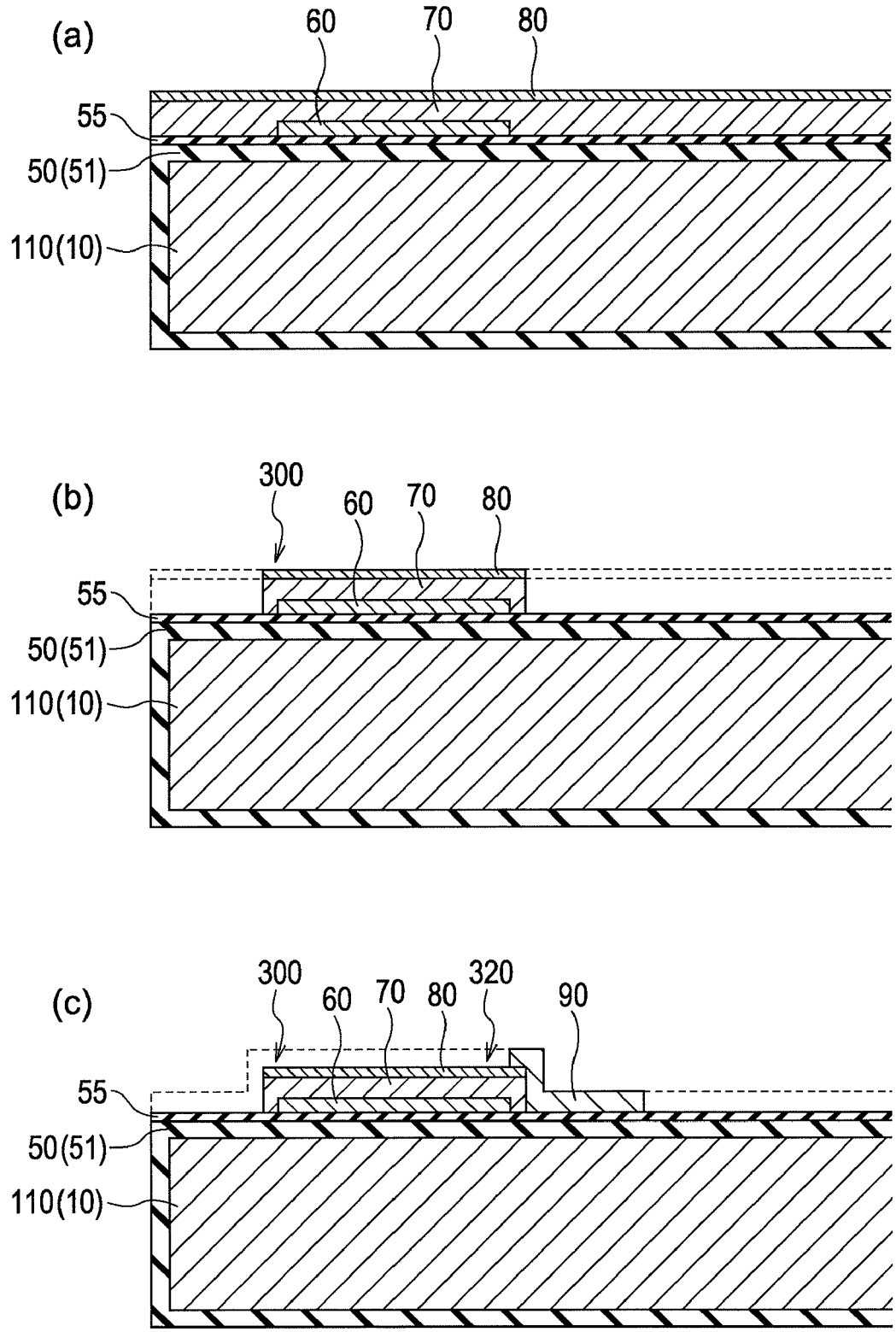
FIG. 5 is a sectional view illustrating the method of manufacturing the printing head according to the invention.

Subsequently, as shown in (a) of FIG. 5, the upper electrode film 80 made of iridium (Ir), for example, is formed across the piezoelectric layer 70. Subsequently, as shown in (b) of FIG. 5, the piezoelectric layer 70 and the upper electrode film 80 are patterned in an area opposite each of the pressure generating chambers 12 to form each of the piezoelectric elements 300. As a method of patterning the piezoelectric layer 70 and the upper electrode film 80, dry etching such as reactive ion etching or ion milling can be used.

Subsequently, the lead electrodes 90 are formed. Specifically, as shown in (c) of FIG. 5, the lead electrodes 90 are formed on the entire surface of the flow passage forming substrate wafer 110, and then each of the piezoelectric elements 300 are patterned through a master pattern (not shown) including a resist, for example.

Figure 6:
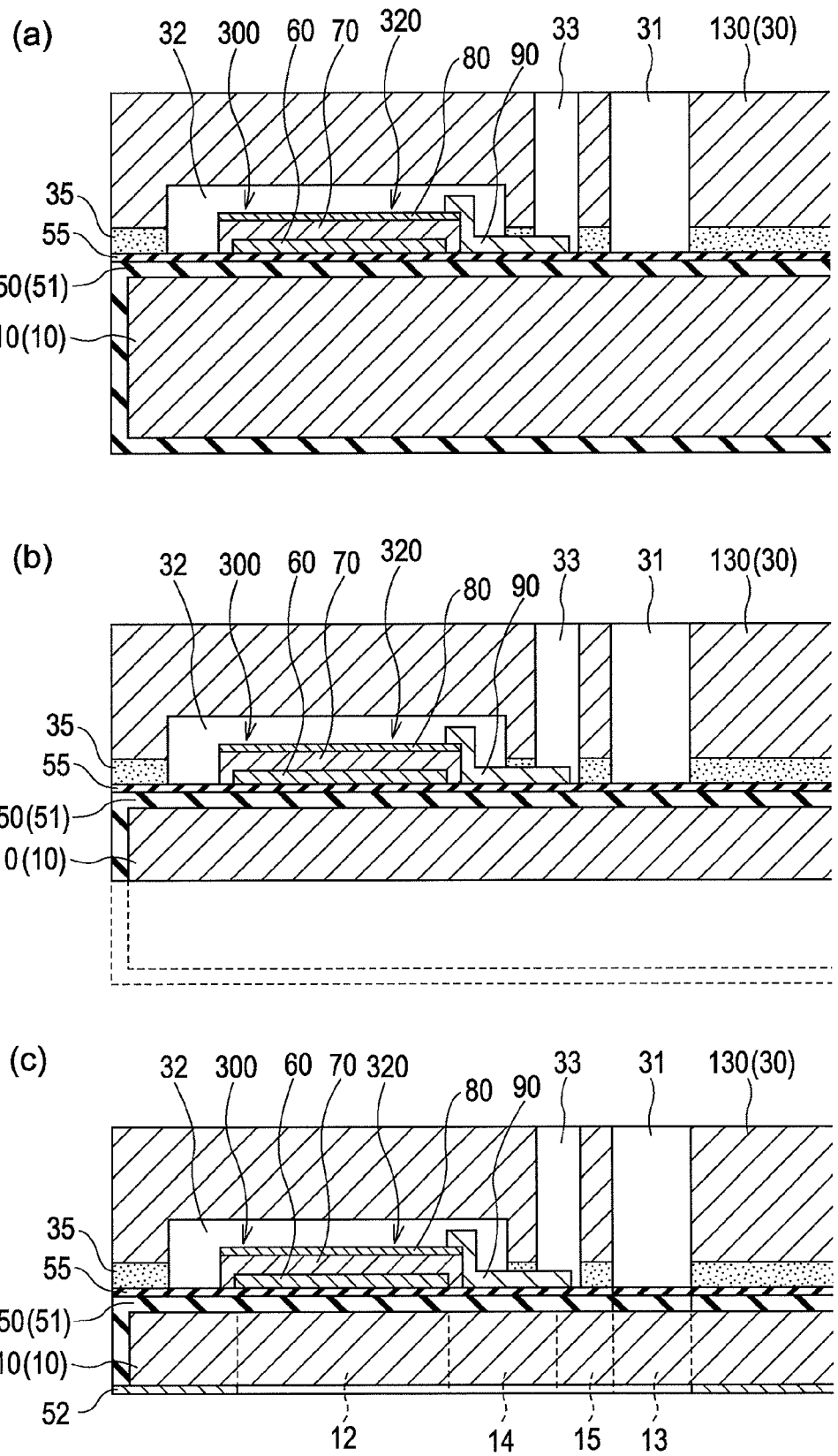
FIG. 6 is a sectional view illustrating the method of manufacturing the printing head according to the invention.

Subsequently, as shown in (a) of FIG. 6, the protective substrate wafer 130 which is a silicon wafer and a plurality of the protective substrates 30 is joined on a side of the piezoelectric elements 300 of the flow passage forming substrate wafer 110 through the adhesive 35.

Figure 7:
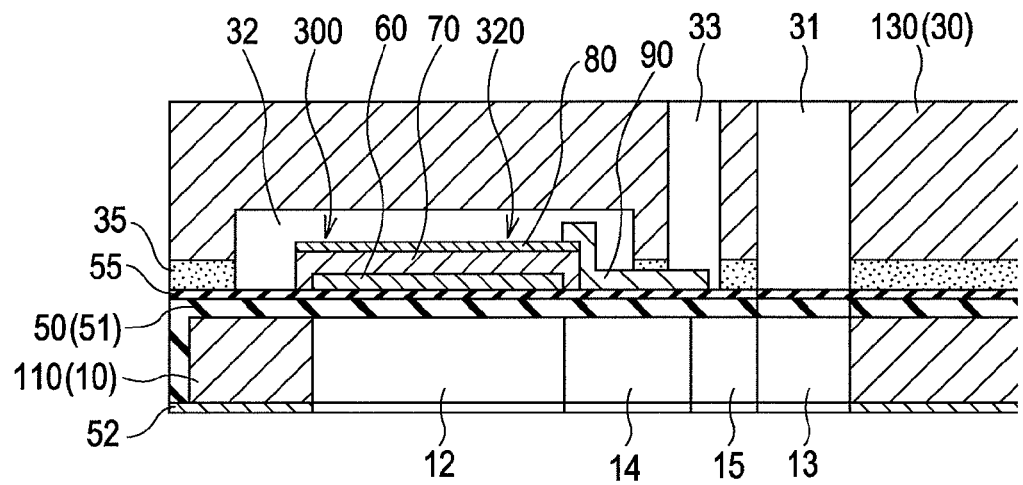
FIG. 7 is a sectional view illustrating the method of manufacturing the printing head according to the invention.

Subsequently, as shown in (b) of FIG. 6, the passage forming substrate wafer 110 is formed so as to have a predetermined thin thickness. Subsequently, as shown in (c) of FIG. 6, a mask film 52 is newly formed on the flow passage forming substrate wafer 110 and patterned in a predetermined shape. Subsequently, as shown in FIG. 7, the pressure generating chambers 12, the communication section 13, the ink supply passages 14, and the communication passages 15 individually corresponding to the piezoelectric elements 300 are formed by allowing the flow passage forming substrate wafer 110 to be subjected to anisotropic etching (wet etching) by use of an alkali solution such as KOH through the mask film 52.

Subsequently, unnecessary portions of the outer peripheries of the flow passage forming substrate wafer 110 and the protective substrate wafer 130 are cut and removed by dicing, for example. The nozzle plate 20 having the nozzle openings 21 punched therethrough is joined onto the surface of the flow passage forming substrate wafer 110 opposite the protective substrate wafer 130, the compliance substrate 40 is joined to the protective substrate wafer 130, and the flow passage forming substrate wafer 110 is divided into the passage forming substrates 10 having one chip size, as in FIG. 1, to manufacture the ink jet print head.

First Embodiment

Figure 8:
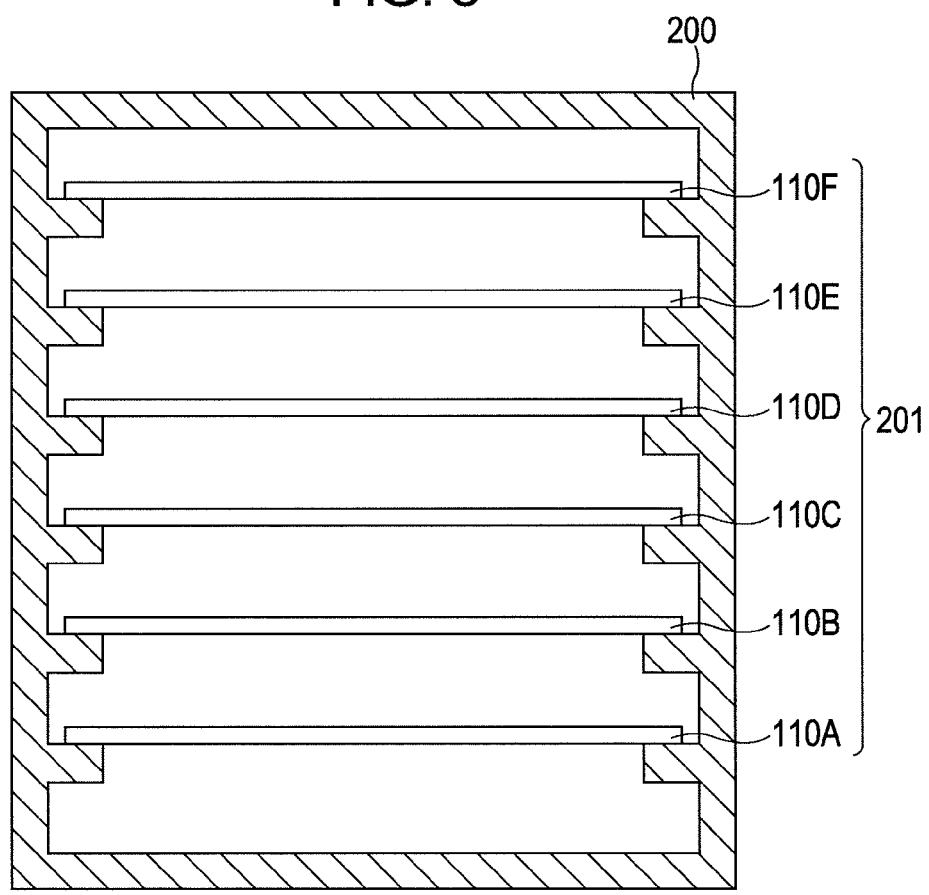
FIG. 8 is a sectional view illustrating a method of manufacturing the printing head according to a first embodiment of the invention.
Figure 9:
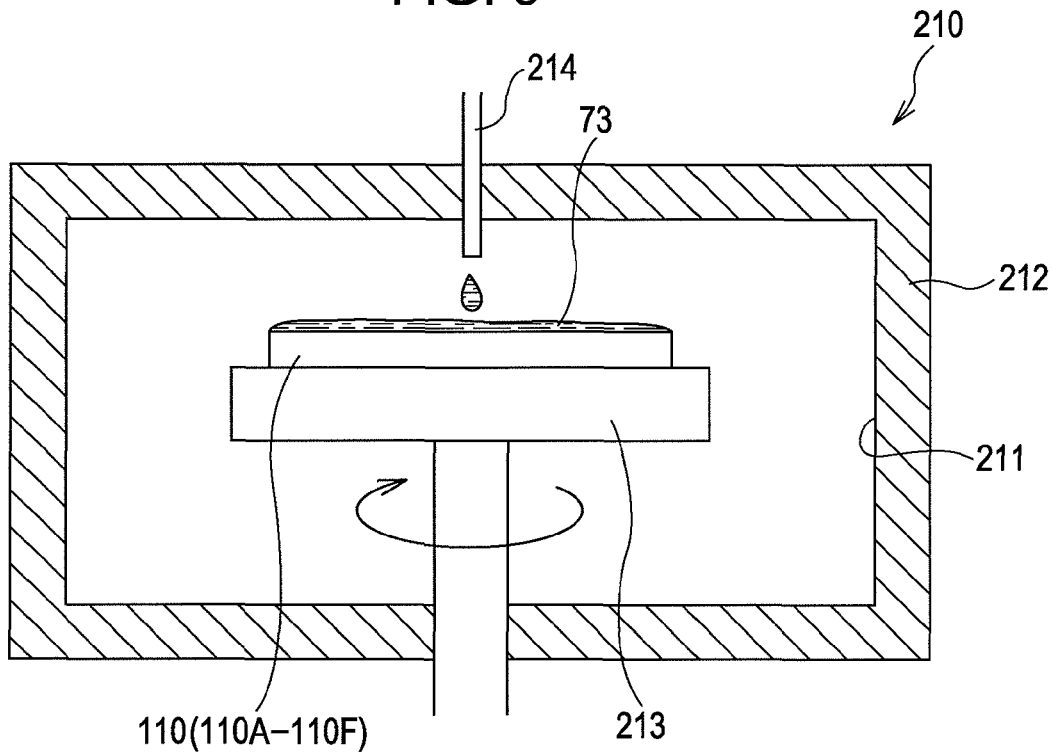
FIG. 9 is a sectional view illustrating the method of manufacturing the printing head according to a first embodiment of the invention.

Hereinafter, a method of manufacturing an ink jet printing head according to the first embodiment of the invention will be described. FIG. 8 is a sectional view illustrating a wafer cartridge. FIG. 9 is a sectional view illustrating a spin coater.

The process of forming the piezoelectric layer 70 according to this embodiment is simultaneously performed in the flow passage forming substrate wafer group constituted by the plurality of flow passage forming substrate wafers 110. For example, as shown in FIG. 8, a plurality of flow passage forming substrate wafers, that is, six flow passage forming substrate wafers 110A to 110F are received in the wafer cartridge 200 to constitute a flow passage forming substrate wafer group 201 in this embodiment. The flow passage forming substrate wafers 110A to 110F are taken out one by one from the flow passage forming substrate wafer group 201 of the wafer cartridge 200 to apply an application solution (sol) onto each of the taken-out flow passage forming substrate wafers 110A to 110F by a spin coating method.

Here, the spin coater for applying the application solution onto the flow passage forming substrate wafers 110A to 110F will be described. As shown in FIG. 9, a spin coater 210 includes a main body 212 having a space serving as an application chamber 211 therein, a rotation table 213 rotatably provided in the application chamber 211, and a supply nozzle 214 supplying an application solution 73 on one surface of the rotation table 213.

The rotation table 213 holds the flow passage forming substrate wafers 110A to 110F on one surface thereof and is provided so as to be rotated by driving means such as a motor (not shown). The supply nozzle 214 drops the sol as the application solution 73 onto the surface of each of the flow passage forming substrate wafers 110A to 110F held on the rotation table 213. The supply nozzle is connected to storing means (not shown) storing the application solution 73.

In the spin coater 210, the application solution 73 can be applied onto the surface of each of the flow passage forming substrate wafers 110A to 110F with a uniform thickness by supplying the application solution 73 on each of the flow passage forming substrate wafers 110A to 110F through the supply nozzle 214, while allowing the rotation table 213 to rotate each of the flow passage forming substrate wafers 110A to 110F.

In addition, the flow passage forming substrate wafers 110A to 110F received in the wafer cartridge 200 are transported sequentially to the spin coater 210 by a transport arm (not shown), and the application solution 73 is applied onto the surfaces of the flow passage forming substrate wafers.

At this time, in the flow passage forming substrate wafer group 201 constituted by the plurality of the flow passage forming substrate wafers 110A to 110F, the piezoelectric precursor films 71 are formed one by one on each of the flow passage forming substrate wafers 110A to 110F. That is, after a first application solution 73 is applied onto a first flow passage forming substrate wafer 110A, the first application solution 73 is applied onto a second flow passage forming substrate wafer 110B. In this way, since the application solution 73 applied onto the second flow passage forming substrate wafer 110B at the time of performing the drying process of drying the application solution 73 applied onto the first flow passage forming substrate wafer 110A to form the piezoelectric precursor film 71, the fat-removing process, and the backing process, the applying process can be effectively performed.

In addition, the plurality of piezoelectric precursor film 71 can be formed by repeatedly performing a process, which includes at least the applying process and the drying process, of forming the piezoelectric precursor films 71 one by one, on each of the flow passage forming substrate wafers 110A to 110F. Here, the applying process of applying the application solution 73 is repeatedly performed by repeatedly performing the process of forming the piezoelectric precursor film 71. However, in order to repeatedly perform the applying process, it is necessary to apply the application solution 73 to be turned into the piezoelectric precursor films 71 subsequent to the second piezoelectric precursor film onto the piezoelectric precursor film 71 at least formed on each of the flow passage forming substrate wafers 110A to 110F. Accordingly, after the piezoelectric films 72 are formed by baking the piezoelectric precursor films 71 one by one, as described above, the application solution 73 to be turned into the piezoelectric precursor film 71 may be applied on the piezoelectric film 72. Alternatively, when the piezoelectric films 72 are formed by simultaneously baking the plurality of piezoelectric precursor films 71 laminated by repeatedly performing the applying process and the drying process, the application solution 73 may be applied onto the piezoelectric precursor film 71.

In this embodiment, when the piezoelectric precursor films 71 are formed one by one on each of the flow passage forming substrate wafers 110A to 110F of the flow passage forming substrate wafer group 201, the formation is performed by varying the order of the flow passage forming substrate wafers 110A to 110F for starting the application of the application solution 73 to be turned into each of the piezoelectric precursor films 71 by the predetermined number of wafers of the flow passage forming substrate wafer group 201.

That is, for example, when twelve piezoelectric precursor films 71 (the piezoelectric films 72) are formed, the application of the application solution 73 to be turned into a first piezoelectric precursor film 71 is started from the flow passage forming substrate wafer 110A in the formation of the first piezoelectric precursor film 71, for example, and then is performed in order of the flow passage forming wafers 110B, 110C, 110D, 110E, and 110F.

Next, when a second piezoelectric precursor film 71 is formed, the application of the application solution 73 to be turned into the second piezoelectric precursor film 71 is started from the flow passage forming substrate wafer 110B, and then is performed in order of the flow passage forming wafers 110C, 110D, 110E, 110F, and 110A.

Next, when a third piezoelectric precursor film 71 is formed, the application of the application solution 73 to be turned into the third piezoelectric precursor film 71 is started from the flow passage forming substrate wafer 110C, and then is performed in order of the flow passage forming wafers 110D, 110E, 110F, 110A, and 110B. Likewise, when the piezoelectric precursor films 71 subsequent to the third piezoelectric precursor film are formed, the order of the flow passage forming substrate wafers 110A to 110F for starting the application of the application solution 73 is varied.

In this embodiment, since the twelve piezoelectric films 72 are formed on the six flow passage forming substrate wafers 110A to 110F, the process of applying the application solution 73 to be turned into each piezoelectric precursor film 71 on the flow passage forming substrate wafers 110A to 110F is circulated twice times.

In this way, by varying the order of the flow passage forming substrate wafers 110A to 110F for starting the application of the application solution 73 to be turned into each piezoelectric precursor film 71, it is possible to prevent occurrence of a difference in the thickness of the piezoelectric layer 70 between the flow passage forming substrate wafers 110.

Additionally, when the application of the application solution 73 to be turned into each piezoelectric precursor film 71 is typically started from the predetermined flow passage forming substrate wafer 110A, the difference in the thickness of the piezoelectric layer 70 formed on each of the flow passage forming substrate wafers 110A to 110F may occur. The difference in the thickness of the piezoelectric layer 70 shows a tendency to be gradually thicker from the flow passage forming substrate wafer 110A in which the formation of the piezoelectric precursor film 71 is started to the flow passage forming substrate wafer 110F in which the formation of the piezoelectric precursor film 71 is finished.

It is considered that the difference in the thickness of the piezoelectric layer 70 is caused since a solvent contained in the application solution 73 evaporates within the application chamber 211 due to the repeated application of the application solution 73 onto each of the flow passage forming substrate wafers 110A to 110F and the concentration of the solvent contained in atmosphere within the application chamber 211 varies at the time of applying the application solution 73 onto each of the flow passage forming substrate wafers 110A to 110F. Accordingly, in this embodiment, by varying the order of the flow passage forming substrate wafers 110A to 110F for starting the application of the application solution 73 to be turned into each piezoelectric precursor film 71, it is possible to prevent occurrence of a difference in the thickness of the piezoelectric layer 70 between the plurality of flow passage forming substrate wafers 110.

Moreover, when the flow passage forming substrate wafers 110A to 110F are separated to form the ink jet printing head having one chip size like the above-described manufacturing method, an ink ejection characteristic can be made uniform by allowing the thickness of the piezoelectric layer 70 to be uniform in the ink jet printing heads separated from the plurality of flow passage forming substrate wafers 110A to 110F, and thus. Accordingly, when the plurality of ink jet printing heads are combined to be mounted on the ink jet printing apparatus or the like, it is possible to improve a print quality by allowing the ink ejection characteristic to be uniform. Moreover, it is possible to simplify the manufacturing process, since a work for distinguishing the ink jet printing heads on the basis of the ink ejection characteristic and combining the ink jet printing heads having the same ink ejection characteristic is not necessary.

In this embodiment, the twelve piezoelectric films 72 are formed on the flow passage forming substrate wafer group 201 constituted by the six flow passage forming substrate wafers 110A to 110F. However, the number of the flow passage forming substrate wafers 110 constituting the flow passage forming substrate wafer group 201 and the number of the laminated piezoelectric films 72 are not limited thereto.

For example, when six piezoelectric films 72 are formed on each of twelve flow passage forming substrate wafers 110, the order of the flow passage forming substrate wafers 110 for starting the application of the application solution 73 in each of the piezoelectric precursor films 71 is varied every two wafers.

Alternatively, when four piezoelectric films 72 are formed on each of twelve flow passage forming substrate wafers 110, the order of the flow passage forming substrate wafers 110 for starting the application of the application solution 73 in each of the piezoelectric precursor films 71 is varied every three wafers.

That is, when the flow passage forming substrate wafer group 201 is constituted by the flow passage forming substrate wafers 110 of which the number is an n (where n is an integer) multiple of the number of laminated piezoelectric precursor films 71, the order of the flow passage forming substrate wafers 110 for starting the application of the application solution in each of the piezoelectric precursor films 71 in the flow passage forming substrate wafer 110 is varied by the n number of wafers.

Of course, even when the flow passage forming substrate wafer group 201 is constituted by the flow passage forming substrate wafers 110 of which the number is a multiple other than n (where n is an integer) multiple of the number of laminated piezoelectric precursor films 71, the order of the flow passage forming substrate wafers is varied every two wafers. That is, when five piezoelectric films 72 are formed on each of twelve flow passage forming substrate wafers 110, for example, the order of the flow passage forming substrate wafers 110 for starting the application of the application solution 73 is varied every two wafers.

Alternatively, when eleven piezoelectric films 72 are formed on each of twelve flow passage forming substrate wafers 110, for example, the order of the flow passage forming substrate wafers 110 for starting the application of the application solution 73 in each of the piezoelectric precursor films 71 is varied every one wafer. That is, when the flow passage forming substrate wafer group 201 is constituted by the flow passage forming substrate wafers 110 of which the number is equal to or smaller than the number of piezoelectric precursor films 71 laminated on each of the flow passage forming substrate wafers 110, the order of the flow passage forming substrate wafers 110 for starting the application of the application solution 73 in the formation of the piezoelectric precursor film 71 is varied every one wafer.

In this way, when the order of the plurality of flow passage forming substrate wafers 110 for starting the application of the application solution 73 is equalized in the plurality of flow passage forming substrate wafers 110, the thickness of the piezoelectric layer 70 formed between the plurality of flow passage forming substrate wafers 110 can be made uniform.

Second Embodiment

Hereafter, a method of manufacturing an ink jet printing head will be described according to a second embodiment of the invention.

In the process of forming the piezoelectric layer 70 according to this embodiment, particularly in the applying process of applying the application solution to be turned into the piezoelectric precursor film 71 onto the flow passage forming substrate wafer 110, the application solution is applied onto the flow passage forming substrate wafer 110 under condition that atmosphere within the application chamber is in saturated vapor of the solvent of the application solution and the application chamber is under pressure higher than outside pressure (atmospheric pressure in this embodiment).

Figure 10:
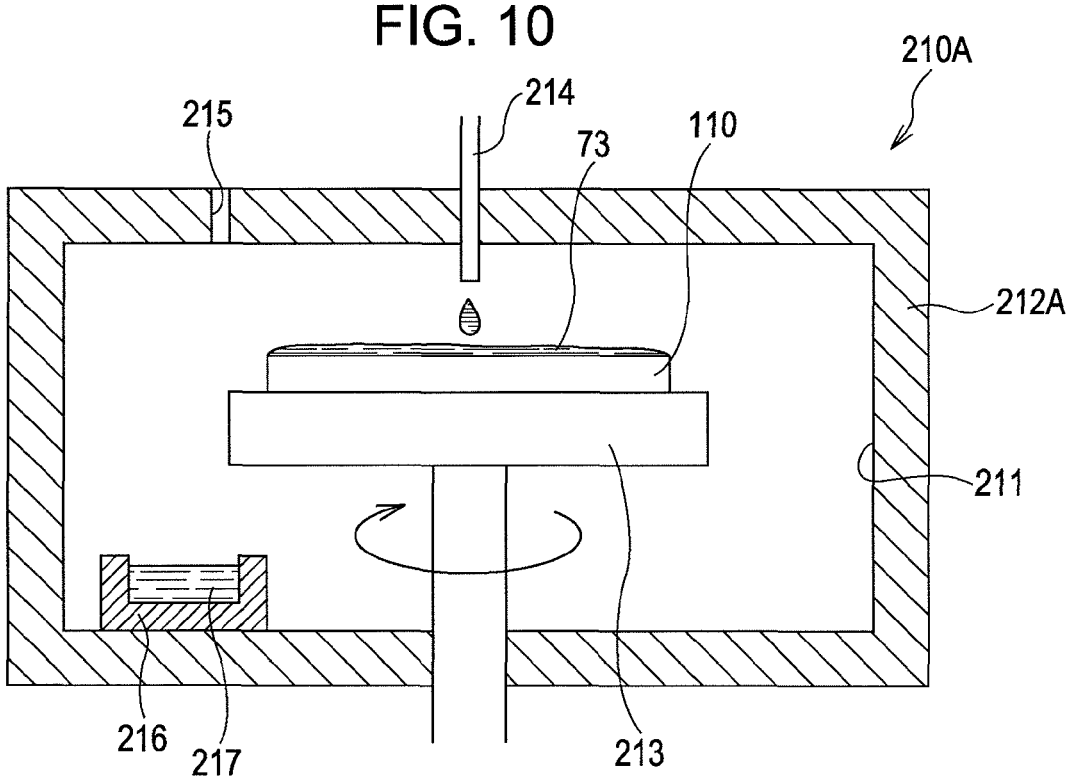
FIG. 10 is a sectional view illustrating a method of manufacturing the printing head according to a second embodiment of the invention.

Here, the spin coater used in the applying process will be described with reference to FIG. 10. FIG. 10 is a sectional view illustrating the spin coater according to this embodiment.

As shown in FIG. 10, a spin coater 210A includes a main body 212A having a space serving as an application chamber 211 therein, a rotation table 213 rotatably provided in the application chamber 211, and a supply nozzle 214 supplying an application solution 73 on one surface of the rotation table 213.

The main body 212A has an empty box-like shape and includes an open hole 215 communicating the application chamber 211 therein to the outside and opening the application chamber 211 to the air.

A case 216 receiving a sol solvent 217 as the application solution 73 to be turned into the piezoelectric precursor film 71 is provided within the application chamber 211 of the main body 212A. An upper surface of the case 216 is opened so that the solvent 217 filled inside the case is easily evaporated within the application chamber 211. As the solvent 217 for forming the piezoelectric element 300 made of PZT, a volatile material such as alcohol is used.

The rotation table 213 holds the flow passage forming wafer 110 on one surface thereof and is provided so as to be rotated by driving means such as a motor (not shown). The supply nozzle 214 drops a sol as the application solution 73 onto the surface of the flow passage forming substrate wafer 110 held by the rotation table 213, and is connected to storing means (not shown) storing the application solution 73.

In the spin coater 210A, the application solution 73 can be applied onto the surface of each of the flow passage forming substrate wafers 110 with a uniform thickness by supplying the application solution 73 on each of the flow passage forming substrate wafers 110 through the supply nozzle 214, while allowing the rotation table 213 to rotate each of the flow passage forming substrate wafers 110.

In this embodiment, since the solvent 217 of the application solution 73 is in an evaporable state within the application chamber 211, the atmosphere within the application chamber 211 is in saturated vapor of the solvent 217 of the application solution 73.

When the application solution 73 is applied onto the flow passage forming substrate wafer 110 during rotation of the flow passage forming substrate wafers 110, the solvent contained in the application solution 73 is evaporated and the pressure is higher than the outside pressure within the application chamber 211. At this time, when the pressure inside the application chamber 211 becomes excessively high, an evaporated amount of solvent contained in the application solution 73 applied to the flow passage forming substrate wafer 110 is smaller and the application solution 73 applied to the flow passage forming substrate wafer 110 is not dried and flies in the vicinity thereof due to the rotation of the flow passage forming substrate wafers 110. Therefore, the thickness of the application solution 73 in the outer circumference of the flow passage forming substrate wafer 110 becomes larger than that of the middle thereof. Accordingly, in this embodiment, by forming the open hole 215 in the main body 212A, the pressure inside the application chamber 211 is slightly larger than the outside pressure.

Additionally, when the pressure inside the application chamber 211 is equal to lower than the outside pressure and the atmosphere inside the application chamber 211 is not in saturated vapor of the solvent contained in the application solution 73, the solvent of the application solution 73 applied on the outer circumference of the flow passage forming substrate wafer 110 is evaporated more quickly than the solvent of the application solution 73 applied on the middle thereof due to the rotation of the flow passage forming substrate wafer 110. This phenomenon is caused by a difference in linear velocity between the middle of the flow passage forming substrate wafer 110 and the outer circumference thereof. In addition, since the solvent contained in the application solution 73 applied on the outer circumference of the flow passage forming substrate wafer 110 is evaporated more quickly than the middle thereof, the thickness of the application solution 73 applied on the outer circumference thereof is thicker than the thickness of the middle thereof.

In this embodiment, the thickness of the application solution 73 in the plane of the flow passage forming substrate wafer 110 can be made uniform by applying the application solution 73 onto the flow passage forming substrate wafer 110 under condition that the atmosphere within the application chamber 211 is in the saturated vapor of the solvent 217 of the application solution 73 and the pressure inside the application chamber 211 is higher than the outside pressure (atmospheric pressure in this embodiment). In this way, it is possible to prevent the difference in the thickness of the piezoelectric layer 70 in the plane of the flow passage forming substrate wafer 110.

When the flow passage forming substrate wafer 110 is separated and the ink jet printing heads having one chip size are formed in the same method as the above-described manufacturing method, the thickness of the piezoelectric layer 70 can be made uniform in the plurality of ink jet printing head separated from the flow passage forming substrate wafer 110 and thus the ink ejection characteristic can be made uniform. Accordingly, when the plurality of ink jet printing heads are combined to be mounted on the ink jet printing apparatus or the like, it is possible to improve a print quality by allowing the ink ejection characteristic to be uniform. Moreover, it is possible to simplify the manufacturing process, since a work for distinguishing the ink jet printing heads on the basis of the ink ejection characteristic and combining the ink jet printing heads having the same ink ejection characteristic is not necessary.

In this embodiment, alcohol is used as the volatile material of the solvent 217 of the application solution 73 and the solvent 217 is placed within the application chamber 211 to allow the solvent 217 to be evaporated. However, the material of the solvent 217 of the application solution 73 is not particularly limited, as long as a solvent is evaporated and saturated within the application chamber 211.

Other Embodiments

The embodiment of the invention has been described, but the invention is not limited to the above-described embodiment in the basic configuration. For example, by combining the first and second embodiments described above, the thickness of the piezoelectric layer 70 between the plurality of flow passage forming substrate wafers 110 and 110A to 110F can be made uniform and the thickness of the piezoelectric layer 70 in the plane of each of the flow passage forming substrate wafers 110 and 110A to 110F can be made uniform. That is, when the piezoelectric precursor films 71 are formed one by one on each of the flow passage forming substrate wafers 110A to 110F of the flow passage forming substrate wafer group 201, the order of the flow passage forming bard wafers 110A to 110F for starting the application of the application solution 73 to be turned into each of the piezoelectric precursor films 71 may be varied by the predetermined number of wafers of the flow passage forming substrate wafer group 201, as described in the first embodiment. In addition, when the application solution 73 is applied onto each of the flow passage forming substrate wafers 110A to 110F, the application solution 73 is applied onto each of the flow passage forming substrate wafers 110A to 110F under condition that the atmosphere within the application chamber 211 is in saturated vapor of the solvent 217 of the application solution 73 and the pressure inside the application chamber 211 is higher than the outside pressure, as described in the second embodiment. In this way, when the ink jet printing heads having one chip size are formed from the plurality of flow passage forming substrate wafers 110 and 110A to 110F, the thickness of the piezoelectric layer 70 can be made uniform, and thus the ink ejection characteristic can be made uniform in each of the ink jet printing heads.

In the above-described method of manufacturing the ink jet printing head, the piezoelectric layer 70 is formed after patterning the lower electrode film 60. However, in terms of the relation with a device, the lower electrode film 60 may be patterned along with the piezoelectric film 72, after the first piezoelectric film 72 is formed on the lower electrode film.

In the above-described first embodiment, the piezoelectric film 72 is formed after performing the applying process, the drying process, the fat-removing process, and the baking process on the piezoelectric precursor film 71. However, the invention is not limited thereto. For example, after the applying process, the drying process, and the fat-removing process on the piezoelectric precursor film 71 are performed plural times, for example, twice, the piezoelectric film 72 may be formed by the baking process.

Figure 11:
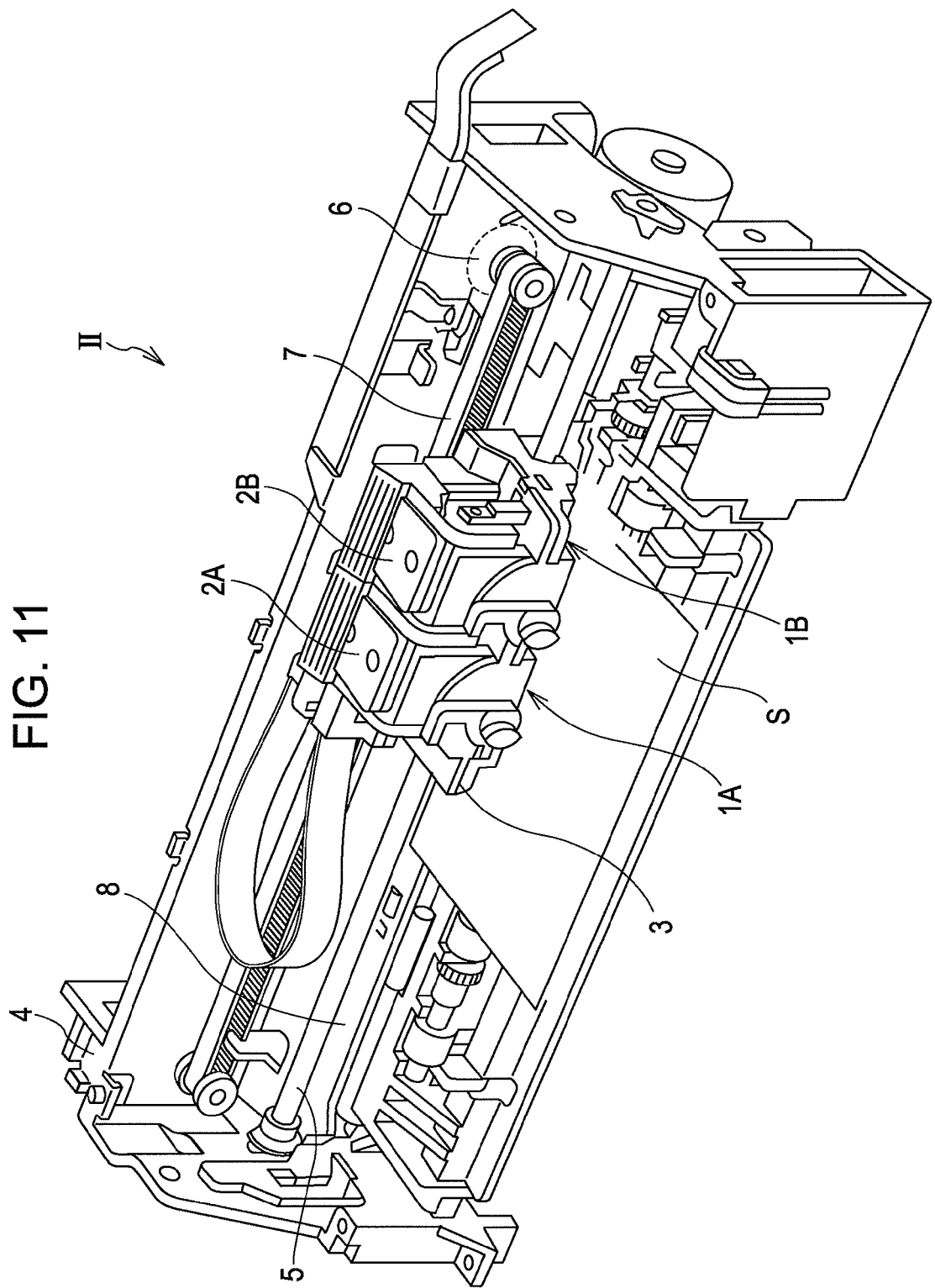
FIG. 11 is a schematic perspective view illustrating a printing apparatus according to an embodiment of the invention.

In the above-described first embodiment, the silicon single crystal substrate is used as the flow passage forming substrate 10, but the invention is not particularly limited thereto. For example, a material such as an SOI substrate or glass may be used. The above-described ink jet printing head I forms a part of a printing head unit having the ink passage communicating with the ink cartridge or the like and is mounted on the ink jet printing apparatus. FIG. 11 is a schematic diagram illustrating an example of the ink jet printing apparatus.

In an ink jet printing apparatus II shown in FIG. 11, printing head units 1A and 1B each having an ink jet printing head I are provided so that cartridges 2A and 2B forming an ink supply unit are detachably mounted, respectively. A carriage 3 mounted with the printing head units 1A and 1B is provided to freely move along a carriage shaft 5 attached to an apparatus main body 4 in a shaft direction. The printing head units 1A and 1B are each configured to eject black ink and color ink, for example.

The carriage 3 mounting the printing head units 1A and 1B is moved along the carriage shaft 5 by delivering a driving force of a driving motor 6 to the carriage 3 through a plurality of toothed-gears (not shown) and a timing belt 7. On the other hand, a platen 8 is formed along the carriage shaft 5 in the apparatus main body 4. In addition, a printing sheet S as a printing medium such as a paper sheet fed by a sheet feeding roller (not shown) or the like is wound by the platen 8 so as to be transported.

In the above-described ink jet printing apparatus II, the ink jet printing heads I (the head units 1A and 1B) are mounted on the carriage 3 and moved in a main scanning direction, but the invention is not particularly limited thereto. For example, the invention is applicable to a so-called line type ink jet printing apparatus in which the ink jet print heads I is fixed and printing is performed just by moving a print sheet S such as a paper sheet in a sub-scanning direction.

In the above-described example, the ink jet printing head has been described as an example of the liquid jet head and the ink jet printing apparatus has been described as an example of a liquid jet apparatus. However, the invention is devised so as to be applied to various liquid jet heads and liquid jet apparatuses. Of course, the invention is applicable to a liquid jet head or a liquid jet apparatus for ejecting a liquid other than ink. Examples of the liquid jet head include various printing heads used for an image printing apparatus such as a printer, a color material jet head used to manufacture a color filter such as a liquid crystal display, an electrode material jet head used to form electrodes such as an organic EL display or an FED (Field Emission Display), and a bio organism jet head used to manufacture a bio chip. Moreover, the invention is applicable to these liquid jet apparatuses including these liquid jet heads.

The invention is not limited to the method of manufacturing the piezoelectric element mounted on the ink jet print head which is a representative example of the liquid jet head, but may be a method of manufacturing a piezoelectric element mounted on other apparatuses.

The invention claimed is:

1. A method of manufacturing a liquid jet head which ejects a liquid, comprising:

forming a lower electrode on one surface of a flow passage forming substrate wafer in which a plurality of flow passage forming substrates each provided with pressure generating chambers individually communicating with nozzle openings for ejecting the liquid are integrally formed;

forming a piezoelectric layer, in which a plurality of piezoelectric films are laminated by repeatedly performing a step of forming a piezoelectric precursor film comprises holding the flow passage forming substrate wafer on a rotation table rotatably provided within an application chamber and applying an application solution to the lower electrode side of the flow passage forming substrate wafer while allowing the rotation table to rotate the flow passage forming substrate and a step of forming of the piezoelectric film by baking the piezoelectric precursor film; and forming an upper electrode on the piezoelectric layer, wherein in the step of forming the piezoelectric precursor film, the application solution is applied onto each of the flow passage forming substrate wafers to form the piezoelectric precursor films one by one on each of the plurality of flow passage forming substrate wafers constituting a flow passage forming substrate wafer group, and an order of the flow passage forming substrate wafers for starting the application of the application solution to be turned into each of the piezoelectric precursor films is varied by a predetermined number of wafers of the flow passage forming substrate wafer group.

2. The method according to claim 1, wherein when the flow passage forming substrate wafer group is constituted by the flow passage forming substrate wafers of which the number is equal to or smaller than the number of piezoelectric precursor films laminated on each of the flow passage forming substrate wafers, the order of the flow passage forming substrate wafers for starting the application of the application solution is varied by one wafer.

3. The method according to claim 1, wherein when the flow passage forming substrate wafer group is constituted by the flow passage forming substrate wafers of which the number is an n (where n is an integer) multiple of the number of piezoelectric precursor films laminated on each of the flow passage forming substrate wafers, the order of the flow passage forming substrate wafers for starting the application of the application solution is varied by the n number of wafers.

4. The method according to claim 1, wherein in the step of forming the piezoelectric precursor films, the application solution is applied onto the flow passage forming substrate wafer under condition that an atmosphere within the application chamber is in saturated vapor of a solvent of the application solution and the application chamber is under pressure higher than outside pressure.

5. A method of manufacturing a piezoelectric element, comprising the steps of:

forming a lower electrode on a substrate;

forming a piezoelectric layer, in which a plurality of piezoelectric films are laminated by repeatedly performing a step of forming a piezoelectric precursor film comprises holding the substrate on a rotation table rotatably provided within an application chamber and applying an application solution to the lower electrode side of the substrate while allowing the rotation table to rotate the substrate and a step of forming the piezoelectric film by baking the piezoelectric precursor film; and forming an upper electrode on the piezoelectric layer, wherein in the step of forming the piezoelectric precursor film, the application solution is applied onto each of the substrates to form the piezoelectric precursor films one by one on each of the plurality of substrates constituting a substrate group, and an order of the substrates for starting the application of the application solution to be turned into each of the piezoelectric precursor films is varied by a predetermined number of substrates of the substrate group.

* * * * *